(12) United States Patent
Xu et al.

(10) Patent No.: US 10,347,532 B2
(45) Date of Patent: Jul. 9, 2019

(54) LOW TEMPERATURE POLY SILICON BACKBOARD, METHOD FOR MANUFACTURING THE SAME AND LIGHT-EMITTING DEVICE

(71) Applicant: BOE TECHNOLOGY GROUP CO., LTD., Beijing (CN)

(72) Inventors: Xiaowei Xu, Beijing (CN); Libin Liu, Beijing (CN); Liangjian Li, Beijing (CN); Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 265 days.

(21) Appl. No.: 15/104,551

(22) PCT Filed: Oct. 15, 2015

(86) PCT No.: PCT/CN2015/091959
§ 371 (c)(1),
(2) Date: Jun. 15, 2016

(87) PCT Pub. No.: WO2016/206236
PCT Pub. Date: Dec. 29, 2016

(65) Prior Publication Data
US 2018/0204769 A1 Jul. 19, 2018

(30) Foreign Application Priority Data
Jun. 23, 2015 (CN) .......................... 2015 1 0350257

(51) Int. Cl.
*H01L 21/77* (2017.01)
*H01L 23/552* (2006.01)
(Continued)

(52) U.S. Cl.
CPC ............ *H01L 21/77* (2013.01); *H01L 23/552* (2013.01); *H01L 27/12* (2013.01); *H01L 27/32* (2013.01);
(Continued)

(58) Field of Classification Search
CPC ....... H01L 21/77; H01L 23/552; H01L 27/12; H01L 27/32; H01L 27/1248; H01L 27/124
(Continued)

(56) References Cited

U.S. PATENT DOCUMENTS

2003/0025848 A1 * 2/2003 Sera .................. G02F 1/136209
349/43
2004/0266040 A1 12/2004 Kim et al.
(Continued)

FOREIGN PATENT DOCUMENTS

CN 101180565 A 5/2008
CN 101285975 A 10/2008
(Continued)

OTHER PUBLICATIONS

Written Opinion of the International Searching Authority and International Search Report for International Application No. PCT/CN2015/091959, dated Mar. 29, 2016. Translation provided by Dragon Intellectual Property Law Firm.
(Continued)

*Primary Examiner* — Dzung Tran
(74) *Attorney, Agent, or Firm* — Harness, Dickey & Pierce, P.L.C.

(57) ABSTRACT

The present disclosure provides a Low Temperature Poly Silicon (LTPS) backboard, a method for manufacturing the LTPS, and a light-emitting device. The LTPS backboard includes: a base substrate, and a thin film transistor (TFT) and a light blocking layer that are arranged above the base
(Continued)

substrate, wherein the light blocking layer is arranged above the TFT, and the light blocking layer is configured for preventing an irradiation light from irradiating onto the TFT.

18 Claims, 5 Drawing Sheets

(51) Int. Cl.
    *H01L 27/12*     (2006.01)
    *H01L 27/32*     (2006.01)

(52) U.S. Cl.
    CPC ...... *H01L 27/3258* (2013.01); *H01L 27/3272* (2013.01)

(58) Field of Classification Search
    USPC ...................................... 257/72, 79; 349/116
    See application file for complete search history.

(56) References Cited

U.S. PATENT DOCUMENTS

| | | | |
|---|---|---|---|
| 2007/0166855 A1* | 7/2007 | Lee | H01L 51/0005 438/29 |
| 2007/0181877 A1* | 8/2007 | Lim | H01L 27/1214 257/59 |
| 2007/0210303 A1* | 9/2007 | Ikeda | H01L 29/78621 257/40 |
| 2009/0066897 A1 | 3/2009 | Katoh et al. | |
| 2011/0198607 A1* | 8/2011 | Mori | H01L 29/78621 257/72 |
| 2011/0254003 A1* | 10/2011 | Tsuzuki | H01L 51/0005 257/57 |
| 2013/0328035 A1* | 12/2013 | Okumoto | H01L 27/1225 257/40 |
| 2015/0249120 A1 | 9/2015 | Cheng et al. | |
| 2015/0369661 A1 | 12/2015 | Lin | |
| 2016/0172387 A1 | 6/2016 | Wang et al. | |
| 2016/0342048 A1 | 11/2016 | Huang | |

FOREIGN PATENT DOCUMENTS

| | | |
|---|---|---|
| CN | 103456764 A | 12/2013 |
| CN | 104465675 A | 3/2015 |
| CN | 104485333 A | 4/2015 |
| CN | 105304656 A | 2/2016 |
| JP | 2003-279734 A | 10/2003 |
| JP | 2015-039004 A | 2/2015 |

OTHER PUBLICATIONS

First Office Action regarding Chinese Application No. 201510350257.4, dated Jul. 4, 2017. Translation provided by Dragon Intellectual Property Law Firm.

Second Chinese Office Action regarding Application No. 201510350257.4 dated Jan. 22, 2018. Translation provided by Dragon Intellectual Property Law Firm.

Third Chinese Office Action regarding Application No. 201510350257.4 dated Jun. 28, 2018. Translation provided by Dragon Intellectual Property Law Firm.

\* cited by examiner

LOW TEMPERATURE POLY SILICON BACKBOARD, METHOD FOR MANUFACTURING THE SAME AND LIGHT-EMITTING DEVICE

CROSS-REFERENCE TO RELATED APPLICATION

This application is the U.S. national phase of PCT Application No. PCT/CN2015/091959 filed on Oct. 15, 2015, which claims priority to Chinese Patent Application No. 201510350257.4 filed on Jun. 23, 2015, the disclosures of which are incorporated in their entirety by reference herein.

TECHNICAL FIELD

The present disclosure relates to the field of the display technology, in particular to a Low Temperature Poly Silicon (LTPS) backboard, a method for manufacturing the LTPS and a light-emitting device.

BACKGROUND

The LTPS technology has been used more and more widely due to its advantages such as ultra thinness, a low weight and low power consumption.

A planarization layer is provided in a structure of a LTPS backboard. The planarization layer is made of a relatively thick organic material. Therefore, during a process of forming the planarization layer, a great amount of exposure generally is needed to completely remove organic materials that require being removed for avoiding the residues. However, the great amount of exposure will cause a deflection of a threshold voltage of a thin film transistor (TFT).

In summary, the ultraviolet light used when the planarization layer is exposed adversely affects properties of the TFT so that the stability of the TFT is reduced.

SUMMARY

An object of the present disclosure is to provide a LTPS backboard, a method for manufacturing the LTPS backboard, and a light-emitting device, so as to improve the stability of the TFT.

In one aspect, the present disclosure provides in some embodiments a LTPS backboard, including: a base substrate, and a TFT and a light blocking layer that are arranged above the base substrate, wherein the light blocking layer is arranged above the TFT.

Alternatively, the light blocking layer includes a light absorption layer, which is configured for absorbing the irradiation light to prevent it from irradiating onto the TFT.

Alternatively, the light absorption layer has a thickness of 200 nm to 440 nm.

Alternatively, the light blocking layer includes a light shielding layer, which is configured for shielding the irradiation light to prevent it from irradiating onto the TFT.

Alternatively, the light shielding layer has a thickness of 50 nm to 500 nm.

Alternatively, the TFT includes: an active layer arranged above the base substrate, wherein a gate insulation layer is arranged on the active layer; a gate electrode arranged above the gate insulation layer, wherein an intermediate insulation layer is arranged on the gate electrode; and a source/drain electrode arranged on the intermediate insulation layer and connected to the active layer through a first via hole arranged in the intermediate insulation layer and the gate insulation layer, wherein the light blocking layer is arranged on the source/drain electrode.

Alternatively, a planarization layer is arranged on the light blocking layer. A first electrode is arranged on the planarization layer, the first electrode is connected to a source/drain electrode through a second via hole arranged in the planarization layer and the light blocking layer, and a pixel definition layer is arranged on the first electrode.

In a further aspect, the present disclosure provides in some embodiment a light-emitting device including the above LTPS backboard and a pixel structure.

In a further aspect, the present disclosure provides in some embodiment a method for manufacturing a LTPS backboard including steps of: forming a TFT above a base substrate; and forming a light blocking layer above the TFT, wherein the light blocking layer is configured for preventing the irradiation light from irradiating onto the TFT Alternatively, the method further includes steps of: forming a planarization layer on the light blocking layer: forming a second via hole in the planarization layer and the light blocking layer, forming a first electrode on the planarization layer, wherein the first electrode is connected to a source/drain electrode of the TFT through the second via hole; and forming a pixel definition layer on the first electrode.

The present disclosure has the following beneficial effects.

In the technical solution of the LTPS backboard, the method for manufacturing the LTPS backboard, and the light-emitting device according to the embodiments of the present disclosure, the LTPS backboard includes a TFT and a light blocking layer. A light blocking layer is arranged above the TFT, and the light blocking layer can prevent an irradiation light from irradiating onto the TFT, so as to prevent the impaction of the irradiation light on the properties of the TFT, and enhance the stability of the TFT.

DETAILED DESCRIPTION

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The LTPS backboard, the method for manufacturing the LTPS backboard and the light-emitting device provided by the present disclosure will be described in detail hereinafter in conjunction with the drawings used in the embodiments, so that a person skilled in the art can better understand the technical solution of the present disclosure.

Figure 1:
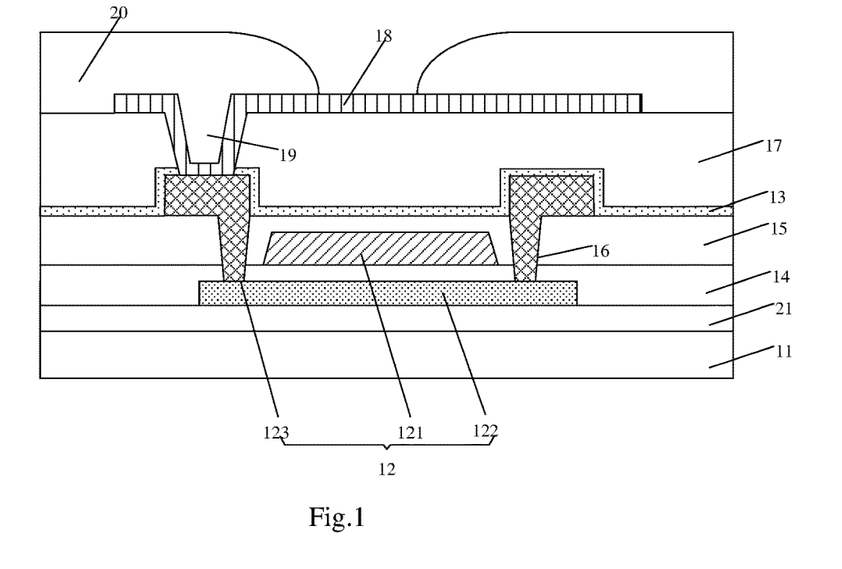
FIG. 1 is a schematic view showing a LTPS backboard according to a first embodiment of the present disclosure.

FIG. 1 shows a schematic view showing a structure of the LTPS backboard according to a first embodiment of the present disclosure. As shown in FIG. 1, the LTPS backboard includes a base substrate 11 and a TFT 12 and a light blocking layer 13 that are arranged above the base substrate 11, the light blocking layer 13 being arranged above the TFT 12 and configured for preventing an irradiation light from irradiating onto the TFT 12.

In this embodiment, the irradiation light is an ultraviolet light, which can be the ultraviolet light used during an exposing process or the ultraviolet light in the environment during subsequent operation of the LTPS backboard.

Alternatively, the light blocking layer 13 may include a light absorption layer, which can absorb the irradiation light to prevent it from irradiating onto the TFT 12. Alternatively, the thickness of the light absorption layer ranges from 200 nm to 440 nm. The material of the absorption layer may include an organic material or a mixture of a plurality of organic materials. For example, the organic material may include P3HT or F8T2, or it may include an inorganic material or a mixture of a plurality of organic materials. For example, the inorganic material may include zinc oxide or titanium oxide. The light absorption layer can absorb the ultraviolet light and particularly can absorb the ultraviolet light having a wavelength of 200 nm to 400 nm, so as to prevent the ultraviolet light having the short wavelength from irradiating onto the TFT 12 below the light absorption layer, and avoid damage that the ultraviolet light does to the TFT.

Alternatively, the light blocking layer 13 may include a light shielding layer, which can shield the irradiation light to prevent it from irradiating onto the TFT 12. Alternatively, the thickness of the light shielding layer ranges from 50 nm to 500 nm. The material of the light blocking layer may include a black resin material or a structure of a composite layer consisting of an insulation layer and a metallic layer. The composite layer may include the insulation layer and the metallic layer arranged above the insulation layer, the insulation layer can be arranged on the TFT 12 to isolate the TFT 12 from the metallic layer, and the metallic layer can shield the irradiation light. The light shielding layer can shield the ultraviolet light and particularly can shield the ultraviolet light having the wavelength of 200 nm to 400 nm, so as to prevent the ultraviolet light having the short wavelength from irradiating onto the TFT 12 below the light shielding layer, and avoid damage that the ultraviolet light does to the TFT In this embodiment, the TFT 12 may include an active layer 122 arranged above the base substrate 11 and provided thereon with a gate insulation layer 14, a gate electrode 121 arranged above the gate insulation layer 14 and provided thereon with an intermediate insulation layer 15, and a source/drain electrode 123 arranged on the intermediate insulation layer 15 and connected to the active layer 122 through a first via hole 16 arranged in the intermediate insulation layer 15 and the gate insulation layer 14, the light blocking layer 13 being arranged on the source/drain electrode 123.

Further, the light blocking layer 13 is provided thereon with a planarization layer 17. Alternatively, the planarization layer 17 is made of a photosensitive material, such as a PI material of DL-1000 series manufactured by the Toray Company. The planarization layer 17 is provided thereon with a first electrode 18, which is connected to the source/drain electrode 123 through a second via hole 19 arranged in the planarization layer 17 and the light blocking layer 13, wherein the first electrode 18 can be an anode, and it is provided thereon with a pixel definition layer (PDL) 20. Specifically, the first electrode 18 is connected to a drain electrode of the source/drain electrode 123 through the second via hole 19.

Further, the LTPS backboard also includes a buffer layer 21, which is arranged on the base substrate 11, and the active layer 122 is arranged on the buffer layer 21.

It should be noted that the positional relation of structures described in this embodiment merely is an optional scheme. During actual implementations, the positional relations of the structures can be changed according to the requirements of products, and the LTPS backboard whose positional relation is changed also falls within the scope of the present disclosure.

In this embodiment, the LTPS backboard includes a TFT and a light blocking layer. The light blocking layer is arranged above the TFT, and the light blocking layer can prevent an irradiation light from irradiating onto the TFT, so as to prevent the impaction of the irradiation light on the properties of the TFT, and enhance the stability of the TFT. The light blocking layer not only can prevent the ultraviolet light from irradiating onto the TFT in the exposing process, but also prevent the ultraviolet light in the environment from irradiating onto the TFT during subsequent operation of the LTPS backboard, so that the stability of the TFT can be enhanced both in the manufacturing process and during the subsequent operation of the LTPS backboard. In this embodiment, enhancement of the stability of the TFT facilitates improving the display uniformity of a light-emitting device.

In a second embodiment, the present disclosure provides a light-emitting device, which includes the LTPS backboard of the above first embodiment and a pixel structure. A description of the LTPS backboard is not repeated herein.

The material of the pixel structure is an organic light emitting material.

Further, the light-emitting device includes a second electrode, which may be arranged above the pixel structure, wherein the second electrode can be a cathode.

In the light-emitting device provided in this embodiment, the LTPS backboard includes a TFT and a light blocking layer. The light blocking layer is arranged above the TFT, and the light blocking layer can prevent the irradiation light from irradiating onto the TFT, so as to prevent the impaction of the irradiation light on the properties of the TFT, and enhance the stability of the TFT. The light blocking layer in the embodiment not only can prevent the ultraviolet light from irradiating onto the TFT in the exposing process, but also prevent the ultraviolet light in the environment from irradiating onto the TFT during subsequent operation of the LTPS backboard, so that the stability of the TFT can be enhanced both in the manufacturing process and in the subsequent operation of the LTPS backboard. In this embodiment, enhancement of the stability of the TFT facilitates improving the display uniformity of the light-emitting device.

Figure 2:
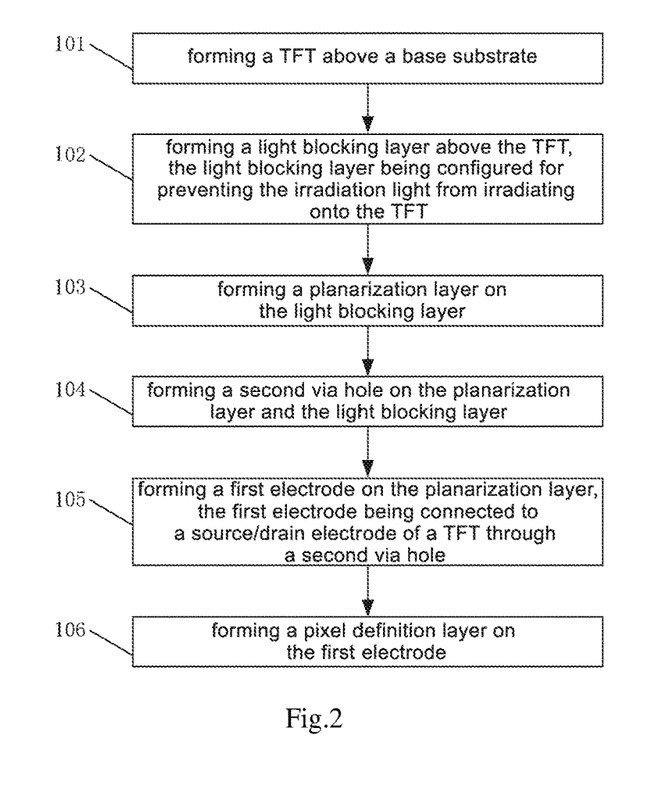
FIG. 2 is a flow chart showing a method of manufacturing a LTPS backboard according to a third embodiment of the present disclosure.

FIG. 2 shows a flow chart showing a method of manufacturing a LTPS backboard according to the third embodiment of the present disclosure. As shown in FIG. 2, the method includes following steps.

Step S101: forming a TFT above a base substrate, wherein the TFT may include a gate electrode, an active layer and a source/drain electrode.

Specifically, Step S101 includes following steps.

Step S1011: forming an active layer above the base substrate.

Figure 3A:
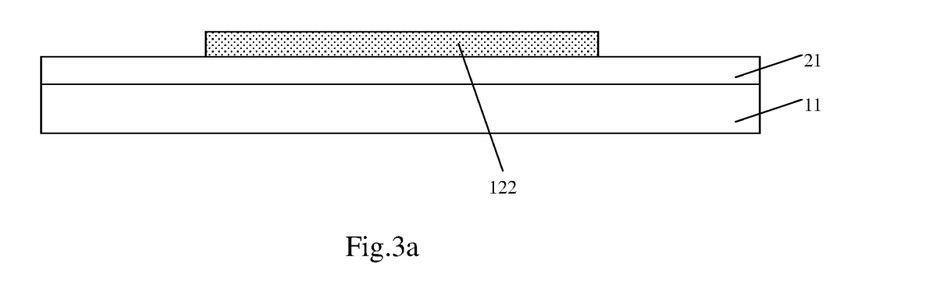
FIG. 3a is a schematic view showing a formation of an active layer according to the third embodiment of the present disclosure.

FIG. 3a is a schematic view showing a formation of an active layer according to the third embodiment of the present disclosure. As shown in FIG. 3a, an active material layer is deposited above the base substrate 11, and a patterning process is performed on the active material layer to form the active layer 122. Alternatively, prior to Step S1011, the Step S101 may further include a step of forming the buffer layer 21 on the base substrate 11, so that the active layer 122 can be formed on the buffer layer 21.

Step S1012: forming a gate insulation layer on an active layer.

Figure 3B:
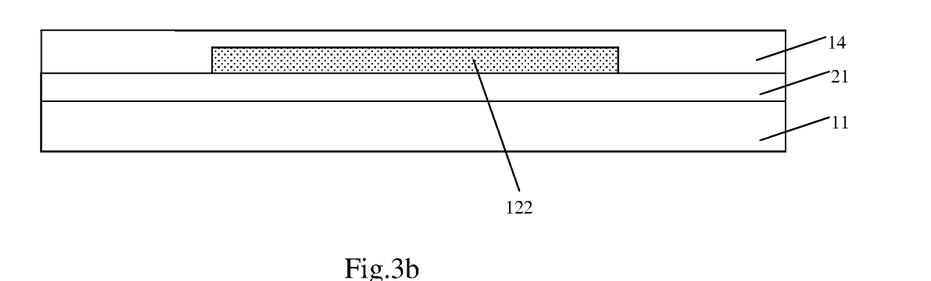
FIG. 3b is a schematic view showing a formation of a gate insulation layer according to the third embodiment of the present disclosure.

FIG. 3b is a schematic view showing a formation of a gate insulation layer according to the third embodiment of the present disclosure. As shown in FIG. 3b, the gate insulation layer 14 is deposited on the active layer 122.

Step S1013: forming a gate electrode on the gate insulation layer.

Figure 3C:
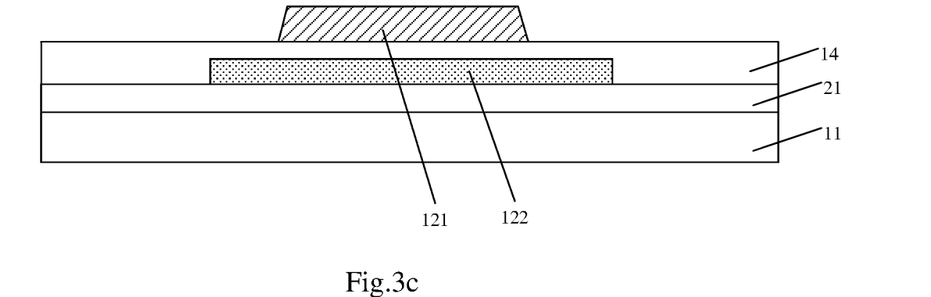
FIG. 3c is a schematic view showing a formation of a gate electrode according to the third embodiment of the present disclosure.

FIG. 3c is a schematic view showing a formation of a gate electrode according to the third embodiment of the present disclosure. As shown in FIG. 3c, a gate material layer is deposited on the gate insulation layer 14, and a patterning process is performed on the gate material layer to form a gate electrode 121.

Step S1014: forming an intermediate insulation layer on the gate electrode.

Figure 3D:
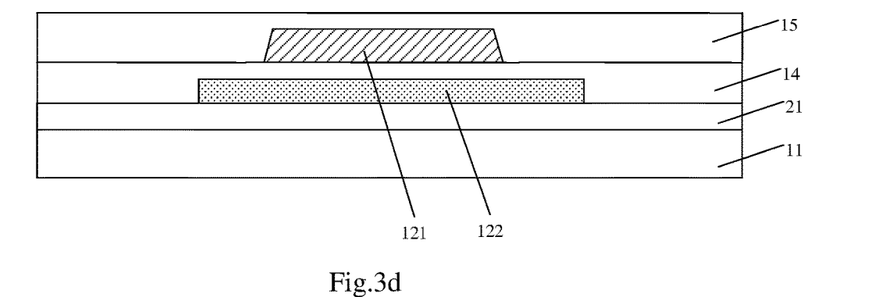
FIG. 3d is a schematic view showing a formation of an intermediate insulation layer according to the third embodiment of the present disclosure.

FIG. 3d is a schematic view showing a formation of an intermediate insulation layer according to the third embodiment of the present disclosure. As shown in FIG. 3d, the intermediate insulation layer 15 is deposited on the gate electrode 12.

Step S1015: forming a first via hole in the intermediate insulation layer and the gate insulation layer.

Figure 3E:
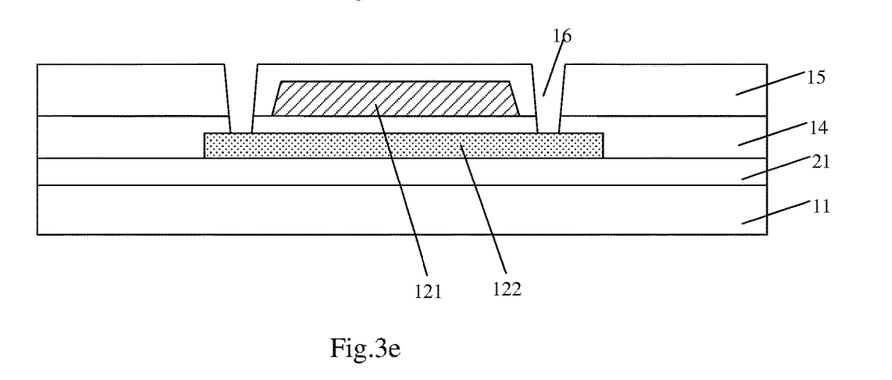
FIG. 3e is a schematic view showing a formation of a first via hole according to the third embodiment of the present disclosure.

FIG. 3e is a schematic view showing a formation of a first via hole according to the third embodiment of the present disclosure. As shown in FIG. 3e, a patterning process is performed on the intermediate insulation layer 15 and the gate insulation layer 14 to form the first via hole 16.

Step S1016: forming a source/drain electrode on the intermediate insulation layer, the source/drain electrode being connected to the active layer through the first via hole.

Figure 3F:
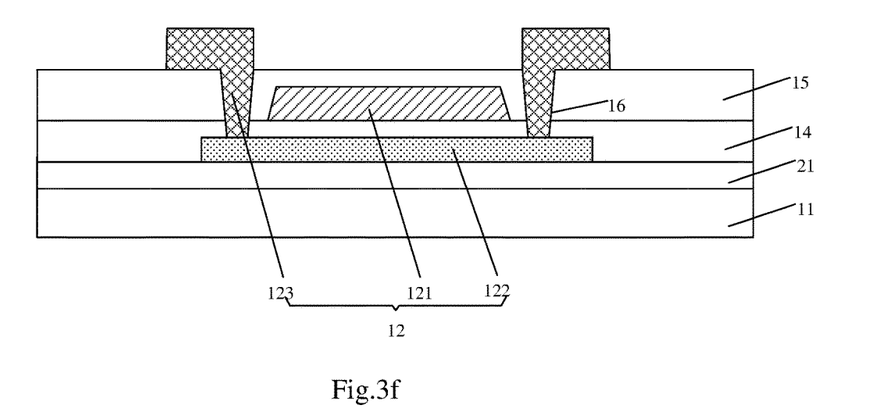
FIG. 3f is a schematic view showing a formation of a source/drain electrode according to the third embodiment of the present disclosure.

FIG. 3f is a schematic view showing a formation of a source/drain electrode according to the third embodiment of the present disclosure. As shown in FIG. 3f, a source/drain material layer is deposited on the intermediate insulation layer, and a patterning process is performed on a source/drain material layer to form the source/drain electrode 123. The first via hole 16 is filled up with the source/drain electrode 123, and the source/drain electrode 123 is arranged on the active layer 122, so that the source/drain electrode 123 and the active layer 122 are connected.

Step S102: forming a light blocking layer above the TFT, the light blocking layer being configured for preventing the irradiation light from irradiating onto the TFT Specifically, a light blocking layer can be formed on a source/drain electrode.

Figure 3G:
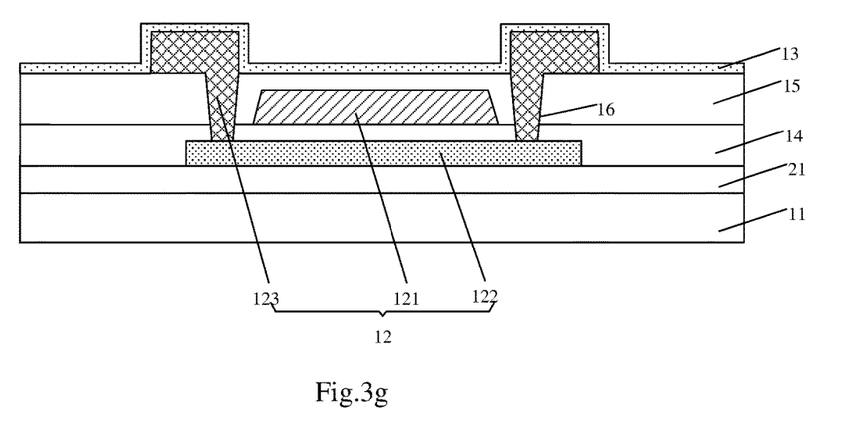
FIG. 3g is a schematic view showing a formation of a light blocking layer according to the third embodiment of the present disclosure.

FIG. 3g is a schematic view showing a formation of a light blocking layer according to the third embodiment of the present disclosure. As shown in FIG. 3g, the light blocking layer 13 is coated on the source/drain electrode 123.

Step S103: forming a planarization layer on the light blocking layer.

Figure 3H:
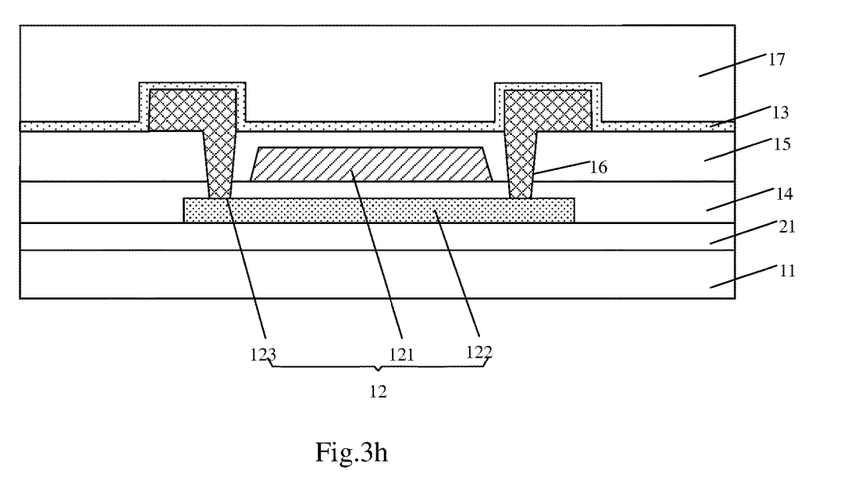
FIG. 3h is a schematic view showing a formation of a planarization layer according to the third embodiment of the present disclosure.

FIG. 3h is a schematic view showing a formation of a planarization layer according to the third embodiment of the present disclosure. As shown in FIG. 3h, the planarization layer 17 is coated on the light blocking layer 13.

Step S104: forming a second via hole on the planarization layer and the light blocking layer.

Figure 3I:
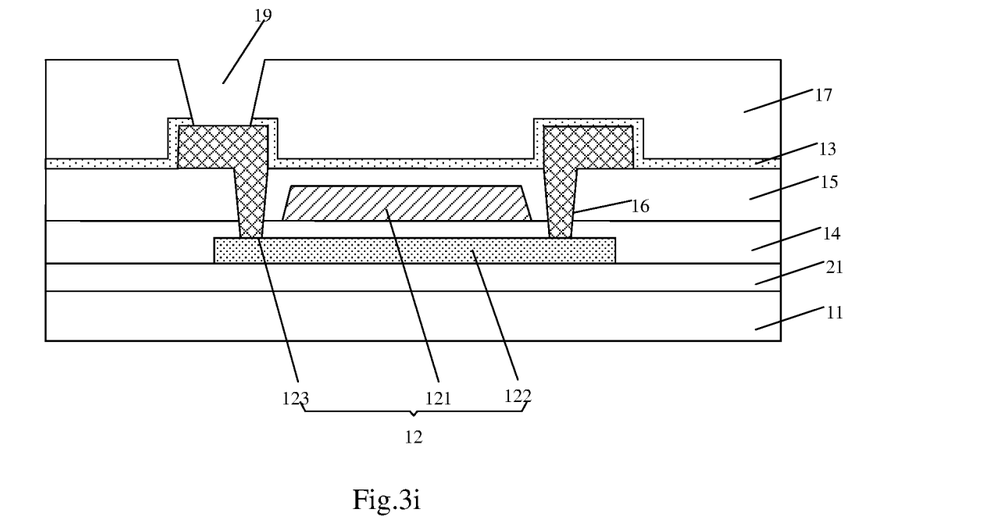
FIG. 3i is a schematic view showing a formation of a second via hole according to the third embodiment of the present disclosure.

FIG. 3i is a schematic view showing a formation of a second via hole according to the third embodiment of the present disclosure. As shown in FIG. 3i, a patterning process is performed on the planarization layer 17 and the light blocking layer 13 to form the second via hole 19 on the source/drain electrode 123. In this embodiment, the planarization layer 17 is made of a photosensitive material, and the light blocking layer 13 is made of a non-photosensitive material. Therefore, the patterning process may includes steps of: exposing and developing the planarization layer 17 to remove a portion of the planarization layer 17, and then etching the light blocking layer 13 by an ashing process or an acid etching process to remove a portion of the light blocking layer 13, so as to form the second via hole 19. During actual implementations, if the planarization layer 17 is made of the non-photosensitive material and the light blocking layer 13 is made of the non-photosensitive material, the patterning process may include processes such as photoresist coating, exposing, developing, etching and photoresist removing. During actual implementations, if the planarization layer 17 is made of the photosensitive material and the light blocking layer 13 is made of the photosensitive material, the patterning process may include processes including exposing and developing.

Step S105: forming a first electrode on the planarization layer, the first electrode being connected to a source/drain electrode of a TFT through a second via hole.

Figure 3J:
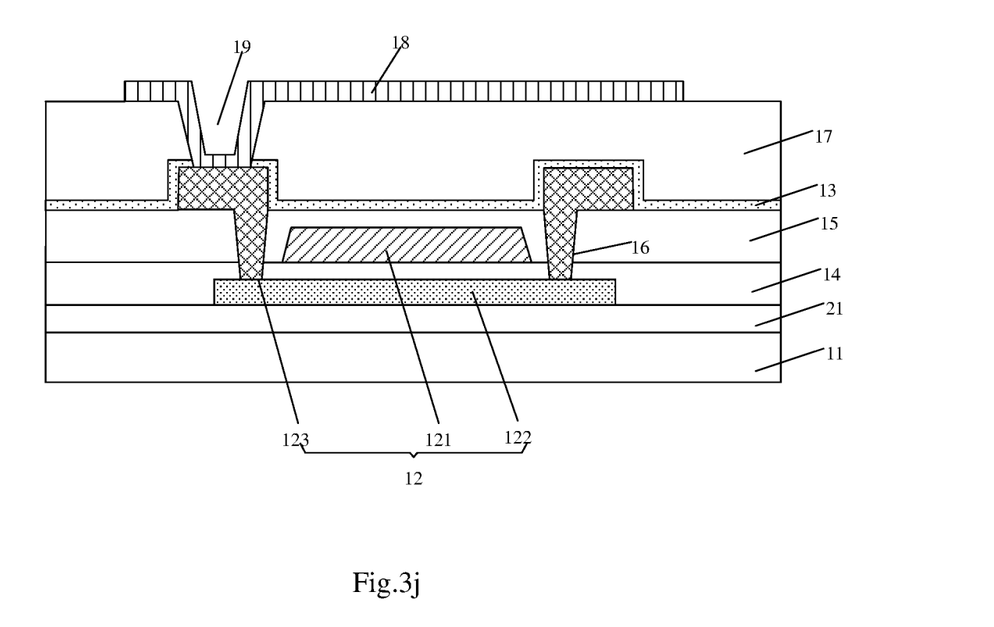
FIG. 3j is a schematic view showing a formation of a first electrode according to the third embodiment of the present disclosure.

FIG. 3j is a schematic view showing a formation of a first electrode according to the third embodiment of the present disclosure. As shown in FIG. 3j, a first electrode material layer is formed on the planarization layer 17, a patterning process is performed on the first electrode material layer to form the first electrode 18, the second via hole 19 is filled up with the first electrode 18, so that the first electrode 18 is connected with a drain electrode of the source/drain electrode 123.

Step S106: forming a pixel definition layer on the first electrode.

As shown in FIG. 1, a pixel definition material layer is formed on the first electrode 18, and a patterning process is performed on the pixel definition material layer to form a pixel definition layer 20.

As a result, the LTPS backboard is manufactured. Afterwards, the method may further include steps of forming a pixel structure through an evaporation process and forming a second electrode above the pixel structure.

Alternatively, the patterning process in each of Step S101, Step S102, Step S105 and Step S106 may include processes such as photoresist coating, exposing, developing, etching and photoresist removing.

The method for manufacturing the LTPS backboard according to this embodiment can be used to manufacture the LTPS backboard as specifically described in the above first embodiment. The LTPS backboard manufactured by the method for manufacturing the LTPS backboard according to the this embodiment includes a TFT and a light blocking layer. The light blocking layer is arranged above the TFT, and the light blocking layer can prevent the irradiation light from irradiating onto the TFT, so as to prevent the impaction of the irradiation light on the properties of the TFT, and enhance the stability of the TFT. In this embodiment, the light blocking layer not only can prevent the ultraviolet light from irradiating onto the TFT in the exposing process, but also can prevent the ultraviolet light in the environment from irradiating onto the TFT during subsequent operation of the LTPS backboard, so that the stability of the TFT can be enhanced both in the manufacturing process and during the subsequent operation of the LTPS backboard. In this embodiment, enhancement of the stability of the TFT facilitates improving the display uniformity of the light-emitting device. It is not necessary to form a further mask plate during the process of manufacturing the light blocking layer, so as to simplify the manufacturing process and reduce the cost.

The above are merely the optional embodiments of the present disclosure, and the present disclosure is not limited thereto. A person skilled in the art may make further modifications and improvements without departing from the principle and spirit of the present disclosure, and these modifications and improvements shall also fall within the scope of the present disclosure.

What is claimed is:

1. A Low Temperature Poly Silicon (LTPS) backboard, comprising:
   a base substrate; and
   a thin film transistor (TFT) and a light blocking layer that are arranged above the base substrate,
   wherein the light blocking layer is arranged above the TFT,
   the light blocking layer continuously covers outer surfaces of a source/drain electrode of the TFT and an intermediate insulation layer adjacent to the source/drain electrode, and the light blocking layer is in direct contact with the outer surfaces of the source/-drain electrode and the intermediate insulation layer,
   the light blocking layer comprises a light absorption layer, and the light absorption layer is configured to absorb ultraviolet light, and
   the light blocking layer further comprises a light shielding layer, the light shielding layer has a structure of a composite layer consisting of an insulation layer and a metallic layer, and the insulation layer is arranged between the metallic layer and the source/drain electrode.

2. The LTPS backboard according to claim 1, wherein the light absorption layer has a thickness of 200 nm to 440 nm.

3. The LTPS backboard according to claim 1, wherein a material of the light absorption layer comprises an organic material or a mixture of a plurality of organic materials.

4. The LTPS backboard according to claim 3, wherein the organic material comprises P3HT or F8T2.

5. The LTPS backboard according to claim 1, wherein a material of the light absorption layer comprises an inorganic material or a mixture of a plurality of inorganic materials.

6. The LTPS backboard according to claim 5, wherein the inorganic material comprises zinc oxide or titanium oxide.

7. The LTPS backboard according to claim 1, wherein the light shielding layer has a thickness of 50 nm to 500 nm.

8. The LTPS backboard according to claim 1, wherein the TFT comprises:
   an active layer arranged above the base substrate, wherein a gate insulation layer is arranged on the active layer;
   a gate electrode arranged above the gate insulation layer, wherein an intermediate insulation layer is arranged on the gate electrode; and
   the source/drain electrode arranged on the intermediate insulation layer and connected to the active layer through a first via hole arranged in the intermediate insulation layer and the gate insulation layer, wherein the light blocking layer is arranged on the source/drain electrode.

9. The LTPS backboard according to claim 1, wherein a planarization layer is arranged on the light blocking layer.

10. The LTPS backboard according to claim 9, wherein the planarization layer is made of a photosensitive material.

11. The LTPS backboard according to claim 9, wherein a first electrode is arranged on the planarization layer, the first electrode is connected to a source/drain electrode through a second via hole arranged in the planarization layer and the light blocking layer, and a pixel definition layer is arranged on the first electrode.

12. The LTPS backboard according to claim 8, further comprising a buffer layer arranged on the base substrate, wherein the active layer is arranged on the buffer layer.

13. A light-emitting device, comprising:
   a Low Temperature Poly Silicon (LTPS) backboard; and
   a pixel structure,
   wherein the LTPS backboard comprises:
      a base substrate; and
      a thin film transistor (TFT) and a light blocking layer that are arranged above the base substrate,
   wherein the light blocking layer is arranged above the TFT,
   the light blocking layer continuously covers outer surfaces of a source/drain electrode of the TFT and an intermediate insulation layer adjacent to the source/drain electrode, and the light blocking layer is in direct contact with the outer surfaces of the source/drain electrode and the intermediate insulation layer,
   the light blocking layer comprises a light absorption layer, and the light absorption layer is configured to absorb ultraviolet light,
   the pixel structure is made of an organic light emitting material, and
   the light blocking layer further comprises a light shielding layer, the light shielding layer has a structure of a composite layer consisting of an insulation layer and a metallic layer, and the insulation layer is arranged between the metallic layer and the source/drain electrode.

14. The light-emitting device according to claim 13, further comprising a second electrode arranged above the pixel structure.

15. A method for manufacturing a Low Temperature Poly Silicon (LTPS) backboard, comprising:
   forming a thin film transistor (TFT) above a base substrate; and
   forming a light blocking layer above the TFT,
   wherein the light blocking layer continuously covers outer surfaces of a source/drain electrode of the TFT and an intermediate insulation layer adjacent to the source/drain electrode, and the light blocking layer is in direct contact with the outer surfaces of the source/drain electrode and the intermediate insulation layer,
   wherein the light blocking layer comprises a light absorption layer, and the light absorption layer is configured to absorb ultraviolet light, and
   wherein the light blocking layer further comprises a light shielding layer, the light shielding layer has a structure of a composite layer consisting of an insulation layer and a metallic layer, and the insulation layer is arranged between the metallic layer and the source/drain electrode.

16. The method according to claim 15, further comprising:
   forming a planarization layer on the light blocking layer;
   forming a second via hole in the planarization layer and the light blocking layer,
   forming a first electrode on the planarization layer, wherein the first electrode is connected to a source/drain electrode of the TFT through the second via hole; and
   forming a pixel definition layer on the first electrode.

17. The LTPS backboard according to claim 1, wherein the light absorption layer is configured to absorb ultraviolet light having a wavelength of 200 nm to 400 nm, and
   wherein the light blocking layer covers an upper surface, a left side surface, and a right side surface of the source/drain electrode.

18. The LTPS backboard according to claim 1, wherein the light blocking layer is of a continuous structure.

* * * * *